United States Patent [19]

Mori

[11] Patent Number: 5,711,814
[45] Date of Patent: Jan. 27, 1998

[54] METHOD OF AND APPARATUS FOR FORMING FILM WITH ROTARY ELECTRODE

[75] Inventor: Yuzo Mori, 16-9, 8-chome Kisaichi, Katano-shi, Osaka 576, Japan

[73] Assignees: Sanyo Electric Co., Ltd., Moriguchi; Yuzo Mori, Katano, both of Japan

[21] Appl. No.: 691,027

[22] Filed: Aug. 7, 1996

[30] Foreign Application Priority Data

Aug. 8, 1995 [JP] Japan .................................. 7-202295
Jul. 31, 1996 [JP] Japan .................................. 8-201722

[51] Int. Cl.$^6$ ...................................................... C23C 16/00
[52] U.S. Cl. ...................... 118/723 E; 118/728; 427/573; 427/569
[58] Field of Search .................... 118/723 E, 723 ER, 118/723 MP, 728; 756/345, 643.1; 216/70, 71; 427/573, 569

[56] References Cited

U.S. PATENT DOCUMENTS

| | | | |
|---|---|---|---|
| 4,460,673 | 7/1984 | Sukigara et al. | 430/128 |
| 4,958,591 | 9/1990 | Yamazaki | 118/723 |
| 5,031,571 | 7/1991 | Igarashi et al. | 118/723 |
| 5,074,456 | 12/1991 | Degner et al. | 228/121 |
| 5,339,039 | 8/1994 | Carlile et al. | 324/655 |
| 5,344,792 | 9/1994 | Sandhu et al. | 437/200 |
| 5,433,813 | 7/1995 | Kuwabara | 156/345 |
| 5,456,757 | 10/1995 | Aruga et al. | 118/723 E |

FOREIGN PATENT DOCUMENTS

| | | | |
|---|---|---|---|
| 2267274 | 11/1990 | Japan | 118/723 E |
| 03193880 | 8/1991 | Japan . | |
| 04337076 | 11/1992 | Japan . | |

*Primary Examiner*—John Niebling
*Assistant Examiner*—Joni Y. Chang
*Attorney, Agent, or Firm*—W. G. Fasse; W. F. Fasse

[57] ABSTRACT

In a method of and an apparatus for forming a thin film on a substrate, a rotary electrode is provided and rotated so that an electrode surface of the electrode moves and passes by a substrate surface due to the rotation of the electrode. Thereby a reaction gas is supplied into a gap between the substrate surface and the electrode surface. A high-frequency power is applied or dc power to the rotary electrode thereby generating a plasma between the substrate surface and the electrode surface, for forming the thin film by chemical reaction of the reaction gas supplied into the plasma.

49 Claims, 14 Drawing Sheets

5,711,814

METHOD OF AND APPARATUS FOR FORMING FILM WITH ROTARY ELECTRODE

BACKGROUND OF THE INVENTION

1. Field of the Invention

The present invention relates to a method of and an apparatus for forming a film by plasma CVD.

2. Description of the Background Art

An apparatus comprising parallel flat electrodes which are arranged in a reaction vessel is known as a plasma CVD apparatus for forming a thin film of amorphous silicon or the like under relatively high pressure by plasma CVD. In such an apparatus, high-frequency power or dc power is applied to one of the electrodes while the other electrode is grounded, so that plasma is generated across or between these electrodes. A reaction gas is supplied into the plasma generated in the aforementioned manner and decomposed by chemical reaction, thereby forming a desired thin film on a substrate.

In order to form a homogeneous thin film in such plasma CVD, it is necessary to homogeneously and efficiently supply the reaction gas into a plasma space. In case of forming a thin film of a large area on the substrate, however, it is difficult to homogeneously and efficiently supply the reaction gas over a wide area. Particularly in case of forming a thin film under high pressure, the reaction gas concentration is so increased that a homogeneous thin film cannot be formed if the reaction gas is heterogeneously supplied to the plasma space.

SUMMARY OF THE INVENTION

An object of the present invention is to provide a film forming method and a film forming apparatus which can form a homogeneous thin film at a high speed in a large area.

The film forming method according to the present invention is adapted to generate plasma by applying high-frequency power or dc power to an electrode and supply a reaction gas into the plasma for forming a thin film on a substrate by chemical reaction, and is characterized in that a rotary electrode is employed as the electrode.

In more concrete terms, the film forming method according to the present invention is adapted to supply a reaction gas into plasma in a reaction vessel for forming a thin film on a substrate by chemical reaction, and comprises the steps of preparing a rotary electrode having an electrode surface moving and passing by the substrate surface due to its rotation, supplying the reaction gas between the substrate surface and the rotary electrode by rotating the rotary electrode to make the electrode surface move and pass by the substrate surface, and applying high-frequency power or dc power to the rotary electrode thereby generating plasma between the substrate surface and the rotary electrode for forming the thin film on the substrate by chemical reaction of the reaction gas which is supplied into the plasma.

On the other hand, the film forming apparatus according to the present invention is adapted to generate plasma by applying high-frequency power or dc power to an electrode and supply a reaction gas into the plasma for forming a thin film on a substrate by chemical reaction, and is characterized in that a rotary electrode is provided as the electrode.

In more concrete terms, the inventive film forming apparatus is adapted to supply a reaction gas into plasma in a reaction vessel for forming a thin film on a substrate by chemical reaction, and comprises a rotary electrode having an electrode surface moving and passing by the substrate surface due to its rotation, driving means for rotating the rotary electrode, reaction gas supply means for supplying the reaction gas into the reaction vessel, a power source for applying high-frequency power or dc power to the rotary electrode thereby generating plasma between the substrate surface and the rotary electrode, and a substrate holder for holding the substrate. This apparatus is characterized in that the rotary electrode so rotates that the electrode surface moves and passes by the substrate surface, whereby the reaction gas is supplied between the substrate surface and the rotary electrode.

According to the present invention, the rotary electrode is preferably so provided that its electrode surface is substantially parallel to the substrate surface. In a preferred aspect of the present invention, a cylindrical electrode is provided as the electrode. In the present invention, the rotary electrode is preferably an electrode rotating about a single axis serving as the center of rotation. The axis serving as the center of rotation is hereinafter referred to as a rotation axis.

According to the present invention, the following effects (1) to (3) can be attained:

(1) It is possible to homogeneously supply the reaction gas to the plasma space at a high speed, whereby the film forming rate and homogeneity of the film can be remarkably improved.

(2) The reaction gas can be efficiently supplied to the plasma space due to rotation of the rotary electrode, whereby the reaction gas can be supplied to the gap even if the distance between the electrode and the substrate is reduced. Thus, utilizability of the reaction gas can be remarkably improved.

(3) It is possible to sufficiently cool the electrode surface, whereby power which is higher than that in the conventional case can be applied for remarkably improving the film forming rate.

The above item (1) will now be described in further detail. The reaction gas is a viscous substance in hydrodynamics. When the gas is fed on a still surface, therefore, the speed of the gas is zero on this surface. When the gas is fed to the gap between the conventional fixed substrate and electrodes, therefore, the gas remains unmoved on the surfaces thereof. In other words, the substrate and the electrodes serve as obstacles for flow of the gas. According to the present invention, however, the electrode itself rotates and hence the gas on the electrode surface also moves at the same speed as the electrode surface. Therefore, the electrode serves not as an obstacle but as motive power for supplying the reaction gas into the plasma space. Thus, the reaction gas can be regularly supplied into the plasma space due to the rotation of the electrode. Further, it is possible to form a homogeneous flow of the reaction gas by controlling this flow by the rotation of the electrode, thereby preparing a homogeneous thin film. According to the present invention, therefore, it is possible to readily supply the reaction gas into the plasma space, for homogeneously supplying atoms and molecules (reaction species) contained in the reaction gas for film formation in large quantities.

The above item (2) will now be described in more detail. According to the present invention, it is possible to efficiently supply the reaction gas into the plasma as described above. Even if the distance between the rotary electrode surface and the substrate is reduced, therefore, the reaction gas can be effectively supplied to the gap. Thus, the gap between the substrate surface and the electrode surface can be made close to that capable of generating plasma as viewed from the mean free path of the gas, whereby the usability of the reaction species contained in the reaction gas and utilizability of the reaction gas can be remarkably improved. Thus, it is possible to form a film at a high speed under relatively high pressure conditions, by controlling the position of the rotary electrode surface and the gap between the same and the substrate surface in high accuracy.

The above item (3) will now be described in more detail. In order to improve the film forming rate, it is necessary to sufficiently supply the reaction gas while supplying sufficient power to the electrode. In general, however, the electrode may be excessively heated and broken if high power is applied. According to the present invention, however, only part of the overall electrode surface is exposed to the plasma in the plasma space since the electrode is a rotary electrode, whereby most part of the electrode surface separated from the plasma region is cooled. Therefore, the electrode is not excessively heated even if high power is applied, whereby the film can be formed at a high speed by applying high power.

According to the present invention, the electrode surface can be made irregular. Due to such irregularity of the electrode surface, the reaction gas can be further efficiently supplied to the plasma space.

Such irregularity of the electrode surface can be provided by forming projections or depressions on the electrode surface in the form of stripes along the direction of the rotation axis, for example. When such projections or depressions are provided in the form of stripes along the rotation axis, it is possible to intermittently generate plasma. Namely, plasma is generated when each projection approaches the substrate, while such generation of the plasma is interrupted when each depression approaches the substrate. Due to such intermittent plasma discharge, the film forming rate can be controlled thereby forming a homogeneous thin film.

According to the present invention, further, projections or depressions may be formed on the electrode surface to be continuous along the direction of rotation of the electrode. Such an electrode is formed by arranging a plurality of discs to be parallel to each other along the direction of the rotation axis, for example. Alternatively, projections extending in the form of loops or depressions such as grooves may be formed in the peripheral direction on the electrode surface of a cylindrical electrode. When such an electrode is employed, plasma is preferentially discharged in the portions provided with the projections or protrusions between the depressions, so that the thin film is increased in thickness in prescribed portions. Thus, it is possible to form a pattern by forming such projections on regions to be preferentially provided with the thin film and controlling the film thickness.

According to the present invention, further, insulating regions and conductive regions can be formed on the electrode surface thereby restrictively providing electrode regions for generating plasma on the electrode surface. The insulating regions can be provided by forming grooves or holes on the electrode surface and embedding an insulating material in such grooves or holes, for example. Various patterns can be employed for such conductive and insulating regions. For example, conductive regions can be provided in the form of stripes along the direction of the rotation axis. When stripe-shaped grooves are formed on the electrode surface along the direction of the rotation axis and an insulating material is embedded in the grooves, for example, the remaining regions of the electrode can be formed as stripe-shaped conductive regions. Intermittent plasma generation can be implemented by employing such an electrode, similarly to the case of the stripe-shaped projections or depressions.

The conductive and insulating regions can alternatively be formed to be continuous along the direction of rotation. Such an electrode can be formed by forming loop-shaped grooves on the electrode surface along the direction of rotation, and embedding an insulating material in these grooves. Thus, a thin film can be preferentially formed on substrate portions corresponding to the conductive regions, similarly to the electrode provided with the projections or depressions continuously along the direction of rotation.

According to the present invention, conductive wires may be bonded to the peripheral surface of the rotary electrode, to define an applied electrode part for plasma generation by such conductive wires. These wires are provided on the peripheral surface part of the rotating electrode to form a network, for example.

In case of forming a thin film of a large area in the present invention, the electrode is relatively moved on the substrate, for forming the thin film while moving the plasma generating region on the substrate. The electrode may be moved with respect to the substrate, or vice versa. Alternatively, both of the electrode and the substrate can be moved together.

When the electrode is relatively moved with respect to the substrate, a grounding electrode for generating plasma between the electrode and the substrate can be provided as a linear electrode, to be moved with the movement of the rotary electrode. The plasma can be concentratively generated by preparing the grounding electrode as a linear electrode, thereby solving a problem caused by spreading of the plasma space such as that the thin film is deposited as large grains, for example.

As another means for concentrating the plasma, a magnet may be provided under the substrate. Such a magnet may be prepared as a linear magnet similarly to the case of the linear grounding electrode, so that this magnet is moved with the movement of the rotary electrode as needed.

As hereinabove described, the present invention provides a method which can further homogeneously supply the reaction gas to the plasma space. Therefore, the present invention is useful in case of forming the thin film under high pressure, in particular. For example, the present invention is particularly useful under a condition of atmosphere pressure, i.e., the total pressure in a reaction vessel, exceeding 1 Torr. The partial pressure of the reaction gas is preferably at least 0.01 Torr. The total pressure in the reaction vessel is more preferably 100 Torr to 1 atm., and further preferably about 1 atm. On the other hand, the partial pressure of the reaction gas is more preferably 0.1 to 50 Torr, and further preferably 5 to 50 Torr.

The reaction vessel can contain inert gas, in addition to the reaction gas. Examples of such inert gas are He, Ne, Ar, Kr and Xe.

The reaction vessel can further contain hydrogen gas. The partial pressure of hydrogen gas is preferably at least 1 Torr, and more preferably 1 to 50 Torr. When hydrogen gas is added into the reaction vessel, it is possible to reduce formation of fine grains resulting from decomposition of the reaction gas. The reason why formation of fine grains is reduced due to addition of hydrogen gas has not yet been clarified, but is presumed to be as follows:

First, it is conceivable that the added hydrogen gas is decomposed in the plasma to form atomic hydrogen, which in turn reacts with a decomposition product such as $SiH_n$ (n=1 to 3) from the reaction gas such as silane gas ($SiH_4$), for example, to inhibit aggregation of such a decomposition product.

Second, it is conceivable that part of the applied power is consumed for decomposition of hydrogen or the like due to addition of hydrogen gas, whereby the power utilized for decomposition of the reaction gas such as silane gas is substantially reduced and hence the amount of decomposition of the reaction gas such as silane gas is reduced.

It is presumed that aggregation of the reaction gas decomposition product is reduced due to the aforementioned reasons, to reduce generation of fine powder.

The peripheral velocity of the electrode surface is preferably at least 10 m/sec. and not more than the velocity of sound. If the peripheral velocity is smaller than this range, supply of the reaction gas to the plasma space may be insufficient. If the peripheral velocity exceeds the sound velocity, on the other hand, this results in the problem of a shock wave. The peripheral velocity of the electrode surface is more preferably 50 m/sec. to the sound velocity, and further preferably 50 to 200 m/sec.

The distance between the rotary electrode and the substrate is preferably about the mean free path of the reaction gas. When silane gas or the like is employed as the reaction gas, therefore, the distance between the electrode and the substance is preferably 0.01 to 1 mm. This distance between the electrode and the substrate is more preferably 0.01 to 0.3 mm, and further preferably 0.05 to 0.3 mm.

According to the present invention, high-frequency power is applied to the rotary electrode preferably in the form of pulses. Stable plasma can be maintained over a wide range by applying the high-frequency power in the form of pulses. Further, it is possible to suppress generation of fine grains by decomposition of the reaction gas, and improve the film quality. The duty ratio of the high-frequency power applied in the form of pulses is preferably at least 1/100. A modulation frequency modulating the power in the form of pulses is preferably at least 100 kHz.

Further, the frequency of the high-frequency power applied to the rotary electrode is preferably at least 13.56 MHz, and more preferably at least 150 MHz.

According to the present invention, the density of the applied high-frequency power is preferably at least 10 W/cm$^2$, more preferably 10 to 100 W/cm$^2$, and further preferably 30 to 100 W/cm$^2$.

According to the present invention, the substrate temperature for forming the thin film is preferably in the range of the room temperature to 500° C., and more preferably in the range of the room temperature to 300° C.

In the inventive film forming apparatus, the overall surface of the rotary electrode is preferably covered with an insulating film. When the overall surface of the rotary electrode is covered with an insulating film, plasma can be stably generated and maintained over a wide range even if the substrate is made of a conductive material such as a metal. The insulating film is preferably prepared from a hard carbon film such as an insulating ceramics film, a diamond film, or a diamond-like carbon film. The insulating ceramics film is preferably prepared from an oxide of $Al_2O_3$, $SiO_2$, $ZrO_2$, $Y_2O_3$, CaO, MgO or BaO, a fluoride such as $CaF_2$ or $MgF_2$, still another compound such as $CaTiO_3$ or $BaTiO_3$, a carbide or a nitride of Si, or the like.

The thickness of the insulating film is preferably 1 μm to 1 mm. The insulating film may be broken to exhibit no effect of covering if the thickness of the insulating film is too small, while stable plasma may not be generated if the thickness is too large.

In a film forming apparatus according to another preferred aspect of the present invention, a gas circulatory system for circulating the gas in the reaction vessel is connected to the reaction vessel for collecting and removing fine grains from the gas. When the apparatus comprises such a gas circulatory system, the amount of fine grains contained in the gas can be reduced in the reaction vessel, for forming a further excellent film.

Means for removing the fine grains in the gas circulatory system can be prepared from a powder removing filter. The powder removing filter is prepared by molding acrylic fiber such as anion-exchange fiber or cation-exchange fiber in the form of a filter, for example.

The gas in the reaction vessel can be fed to the gas circulatory system from a duct provided in the reaction vessel. Such a duct is preferably so provided as to position its suction port between the rotary electrode and the substrate, in order to remove fine grains which are present between the rotary electrode and the substrate. Such a duct is preferably prepared from a material having small high-frequency induction loss such as Teflon or alumina, for example.

The suction speed at the suction port of the duct is preferably in excess of the peripheral velocity of the electrode surface, more preferably at least twice the peripheral velocity of the electrode surface, and further preferably at least 10 times the peripheral velocity of the electrode surface.

The flow rate of the gas in the circulatory system is preferably 1 to 100 m$^3$/min.

Further, the film forming apparatus according to the present invention is preferably provided with means for measuring the concentration of the reaction gas in the reaction vessel. Such a concentration sensor may be provided either in the reaction vessel or in the gas circulatory system. This concentration sensor is a sensor for measuring FTIR (Fourier transform infrared absorption spectrum), for example.

In response to the aforementioned measurement of the concentration of the reaction gas, means for supplying the reaction gas can be further provided for holding the concentration of the reaction gas constant in the reaction vessel.

Further, the film forming apparatus according to the present invention is preferably provided with means for measuring the temperature of the reaction gas and means for measuring the temperature on the surface of the rotary electrode. A sensor for measuring the temperature on the surface of the rotary electrode can be an infrared thermometer, for example. The temperature on the surface of the rotary electrode can be controlled by a method of cooling the circulatory gas by a heat exchanger provided in the gas circulatory system in response to the result of measurement by the sensor and introducing the cooled circulatory gas into the reaction vessel thereby controlling the surface temperature of the rotary electrode.

Further, the film forming apparatus according to the present invention is preferably provided with means for measuring the gap between the rotary electrode and the substrate surface. An instrument for measuring such a gap can be a laser light quantity monitor, for example. In more concrete terms, the gap between the rotary electrode and the electrode surface is irradiated with a laser beam from one side and the light quantity is detected by the sensor provided on an opposite side, so that the distance between the rotary electrode and the substrate is measured based on the change or attenuation of the light quantity depending on the gap spacing. In response to the result of the measurement by the sensor, the gap between the rotary electrode and the substrate can be controlled by vertically moving the substrate holder, for example.

According to the inventive thin film forming method, it is possible to supply the reaction gas into the plasma space with rotation of the electrode, thereby improving efficiency of the gas supply to the plasma space. Thus, a further homogeneous thin film can be formed.

When the electrode is so rotated that projections of the electrode or electrode regions such as conductive regions periodically approach the substrate, plasma can be intermittently generated in a prescribed cycle.

When the position of the rotary electrode is not moved with respect to the substrate in the present invention, the thin film can be formed as a line parallel to the rotation axis. When the electrode is moved with respect to the substrate so that the plasma generating region is moved with respect to the substrate, on the other hand, it is achieved that the thin film is formed while moving a linear thin film forming region, whereby a thin film having a large area can be formed.

The thin film which can be formed according to the present invention can be prepared from Si, C (including diamond), SiC, $SiO_2$, $Si_3N_4$, $Al_2O_3$ or AlN, for example. The reaction gas for forming such a thin film can be prepared from a gas containing Si such as $SiH_4$, $Si_2H_6$ or TEOS ($Si(OC_2H_5)_4$), a gas containing C such as $CH_3OH$, CO or $CO_2$, a gas containing Al such as TMA ($Al(CH_3)_3$), or a gas containing O or N such as $O_2$, $N_2O$ or $N_2$. Various thin films can be formed by employing such reaction gases.

In more concrete terms, a reaction gas prepared by combining $CH_4$, $C_2H_2$, $C_2H_6$, $CH_3OH$, $C_2H_5OH$, CO or $CO_2$ with $H_2$ or $H_2O$ can be employed in order to form a carbon film including a diamond thin film.

In order to form an $SiO_x$ film, a reaction gas prepared by combining $SiH_4$, $Si_2H_6$ $SiCl_4$ or $SiHCl_3$ with $O_2$, $CO_2$, $N_2O$ or $H_2O$, or TEOS (polyethoxysilane) can be employed.

In order to form an SiC film, a reaction gas prepared by combining $SiH_4$, $Si_2H_6$, $SiCl_4$, $SiHCl_3$ or $Si(CH_3)_2(OCH_3)_2$ with $CH_4$, $C_2H_2$, $C_2H_6$, CO or $CO_2$ can be employed.

In order to form an SiN film, a reaction gas prepared by combining $SiH_4$, $Si_2H_6$, $SiCl_4$ or $SiHCl_3$ with $NH_3$ or $N_2$ can be employed.

In order to form an AlN film, a reaction gas prepared by combining $Al(CH_3)_3$ or $Al(C_2H_5)_3$ with $N_2$ or $NH_3$ can be employed.

In order to form an $AlO_x$ film, a reaction gas prepared by combining $Al(CH_3)_3$ or $Al(C_2H_5)_3$ with $O_2$, $H_2O$, $N_2O$ or $CO_2$ can be employed.

In order to form a TiN film, a reaction gas prepared by combining $TiCl_4$ or the like with $N_2$ or $NH_3$ can be employed.

In order to form a $TiO_x$ film, a reaction gas prepared by combining $TiCl_4$ or the like with $O_2$, $H_2O$, $N_2O$ or $CO_2$ can be employed.

In order to form a TiC film, a reaction gas prepared by combining $TiCl_4$ or the like with $CH_4$, $C_2H_2$, $C_2H_6$, CO or $CO_2$ can be employed.

In order to form a $ZrO_x$ film, a reaction gas prepared by combining $ZrCl_4$, $Zr(OC_3H_7)_4$ or $Zr(CH_2COCH_2COCF_3)_4$ with $O_2$, $H_2O$, $N_2O$ or $CO_2$ can be employed.

According to the present invention, the electrode is a rotary electrode. Therefore, the reaction gas on the electrode surface is supplied to the plasma generating region with rotation of the electrode, thereby improving supply efficiency of the reaction gas. Thus, a homogeneous thin film can be formed at a higher speed.

When projections or conductive regions are formed on the electrode surface, the plasma can be intermittently generated. Thus, aggregation of a decomposition product in a gas phase can be suppressed, to enable formation of a further homogeneous thin film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
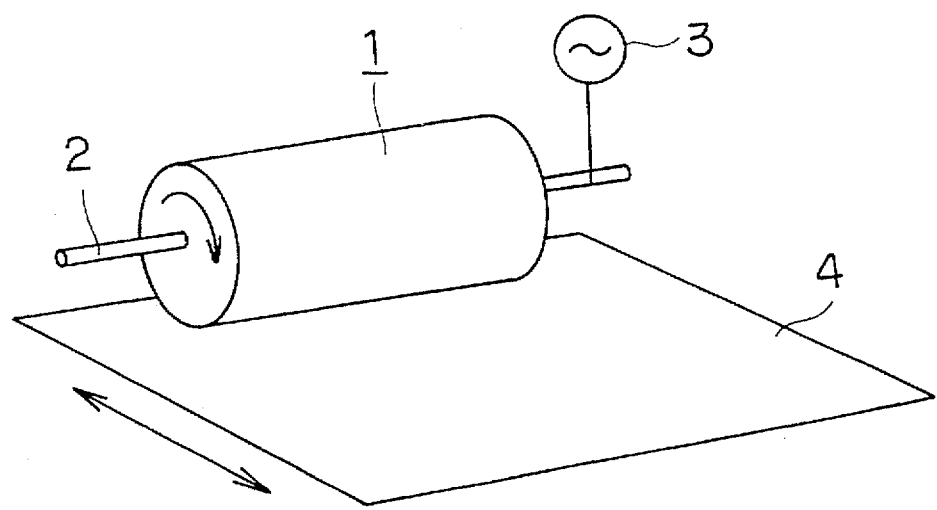
FIG. 1 is a perspective view showing an embodiment of the present invention.

FIG. 1 is a perspective view for illustrating an embodiment of the present invention. Referring to FIG. 1, a cylindrical electrode 1 is employed in this embodiment as an electrode rotating about its rotation axis. This cylindrical electrode 1 is arranged so as to rotate about a rotation axis 2. According to this embodiment, high-frequency power is employed as power to be applied to the cylindrical electrode 1, and a high-frequency source 3 is electrically connected to the rotation axis 2. The cylindrical electrode 1 is provided above a substrate 4 so that its rotation axis 2 is substantially parallel to the surface of the substrate 4. A grounding electrode (not shown) is generally provided under the substrate 4, so that plasma discharge is carried out between or across a surface portion, which is closest to the grounding electrode, of the cylindrical electrode 1 and the grounding electrode.

The cylindrical electrode 1 rotates along the direction of the arrow shown in FIG. 1, so that a gas around the electrode surface also moves with the electrode surface following this rotation. Thus, the gas around the electrode surface is regularly supplied to the plasma space. Therefore, a reaction gas supply efficiency can be improved. When the positions of the cylindrical electrode 1 and the substrate 4 are relatively fixed, a linear thin film is formed under the cylindrical electrode 1. It is possible to continuously form such a linear thin film substantially perpendicularly to the rotation axis 2 by relatively moving the cylindrical electrode 1 with respect to the substrate 4 as shown by the double-headed arrow in FIG. 1. Thus, a thin film having a large area can be formed.

Figure 2:
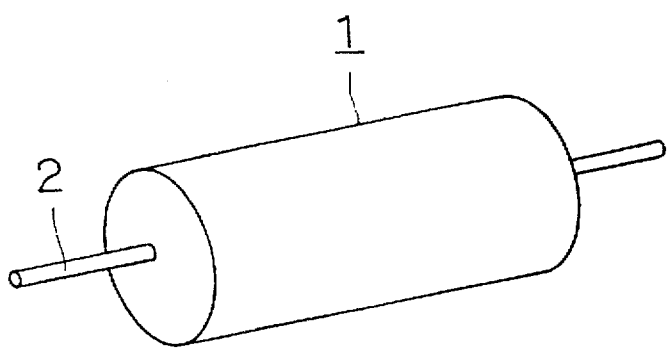
FIG. 2 is a perspective view showing a cylindrical electrode in the embodiment shown in FIG. 1.

FIG. 2 is a perspective view showing the cylindrical electrode 1 in the embodiment shown in FIG. 1. Plasma discharge is made or caused on the surface of the cylindrical electrode 1 as described above, and hence the rotation axis 2 and the electrode surface must be electrically connected with each other when the power source for applying the power to the cylindrical electrode 1 is electrically connected with the rotation axis 2. Preferably, such a cylindrical electrode 1 is formed by a metal drum in general, and the rotation axis 2 is a metal rod.

Figure 3:
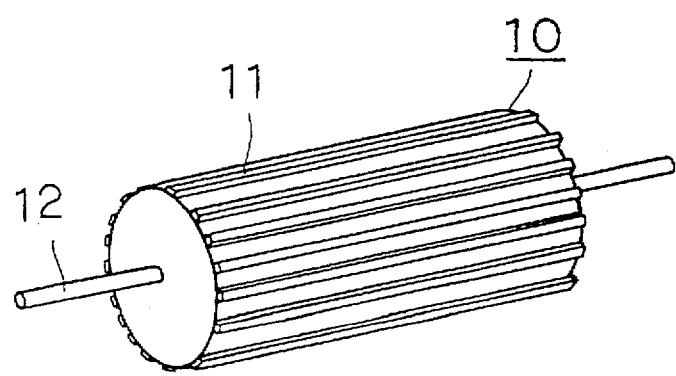
FIG. 3 is a perspective view showing a cylindrical electrode according to another embodiment of the present invention.

FIG. 3 is a perspective view showing a cylindrical electrode 10 according to another embodiment of the present invention. In the cylindrical electrode 10 according to the embodiment shown in FIG. 3, striped-shaped projections 11 are provided along the direction of a rotation axis 12 at regular intervals.

Figure 4:
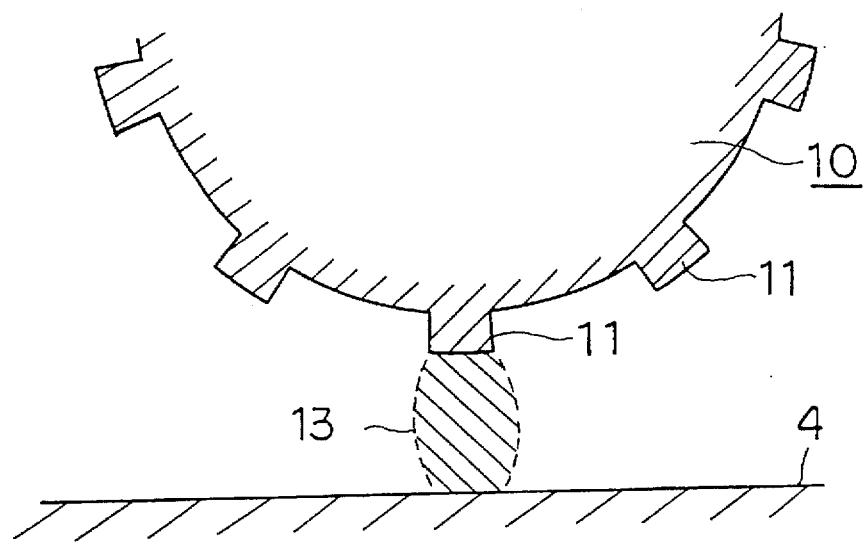
FIG. 4 is a model diagram showing a state of generating plasma with the cylindrical electrode shown in FIG. 3.

FIG. 4 is a model diagram showing a state of generating plasma 13 by the cylindrical electrode 10 shown in FIG. 3. As shown in FIG. 4, the plasma 13 is generated when each projection 11 provided on the electrode surface of the cylindrical electrode 10 approaches a substrate 4. The distance between the forward end of each projection 11 and the substrate 4 is preferably about the mean free path of a reaction gas, as described above. In more concrete terms, the distance is preferably in the range of 0.01 to 1 mm, and more preferably in the range of 0.01 to 0.1 mm.

According to this embodiment, therefore, the plasma 13 can be generated when each projection 11 approaches the substrate 4, whereby the plasma 13 can be intermittently generated. Depending on condition setting, the plasma 13 can continuously be generated so that its strength is periodically changed.

For example, it is possible to intermittently generate plasma at 300 kHz by rotating a cylindrical electrode which is provided on its surface with 1000 projections (the projections are formed at pitches of about 1 mm, if the cylindrical electrode has a diameter of 30 cm) at a rotational frequency of 18,000 rpm (300 Hz). When a power source of 150 MHz in frequency is employed for applying power, it arises that the 150 MHz power is modulated at 300 kHz.

When a dc power source is employed, on the other hand, it arises that a dc voltage is applied with a modulation of 300 kHz.

Application of a higher demodulation (dc) voltage is enabled by increasing the diameter of the cylindrical electrode or refining the pattern of the projections provided on its surface.

According to this embodiment, the projections 11 are so formed on the electrode surface that the reaction gas can be further efficiently supplied due to the rotation of the electrode surface.

Figure 5:
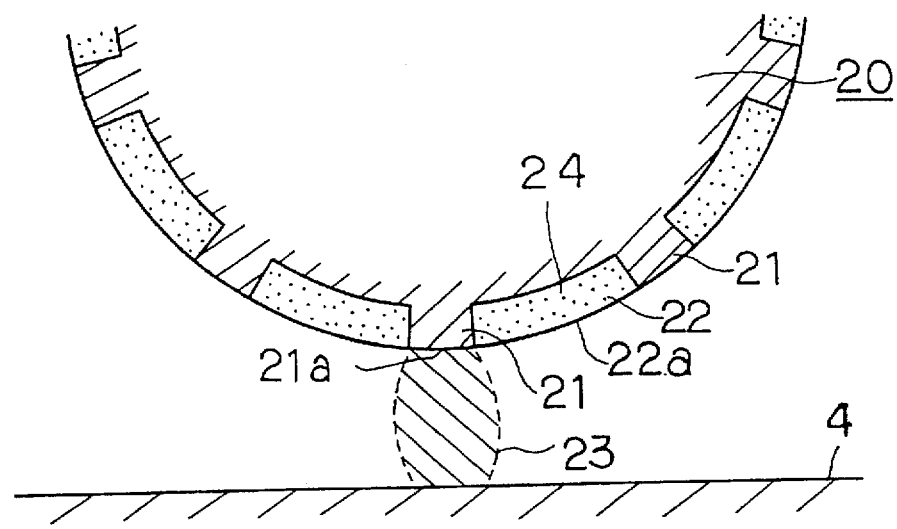
FIG. 5 is a model diagram showing a state of plasma generation in still another embodiment of the present invention.

FIG. 5 is a model diagram showing still another embodiment of the present invention. In the embodiment shown in FIG. 5, projections 21 are formed on a surface of a cylindrical electrode 20, similarly to the embodiment shown in FIG. 4. Therefore, the projections 21 are provided in the form of stripes along a rotation axis. According to this embodiment, insulators 22 of alumina ($Al_2O_3$), quartz ($SiO_2$) or Teflon are embedded in portions of stripe-shaped grooves 24 between the projections 21. In this embodiment, therefore, the electrode surface is flat with no irregularity. On this electrode surface, however, conductive regions 21a and insulating regions 22a are defined by the projections 21 and the insulators 22 respectively. The conductive regions 21a and the insulating regions 22a are provided in the form of stripes along the direction of the rotation axis.

Also in this embodiment, plasma 23 is generated when each conductive region 21a approaches a substrate 4, similarly to the embodiment shown in FIG. 4. Therefore, the plasma 23 can be intermittently generated. Depending on the conditions, on the other hand, the plasma 23 can be continuously generated, and its strength can be changed to be periodically stronger as each conductive region 21a approaches the substrate 4.

According to the present invention, the method of forming the conductive and insulating regions is not restricted to that of the embodiment shown in FIG. 5, but these regions may be so formed that power is applied to the conductive regions.

Figure 6:
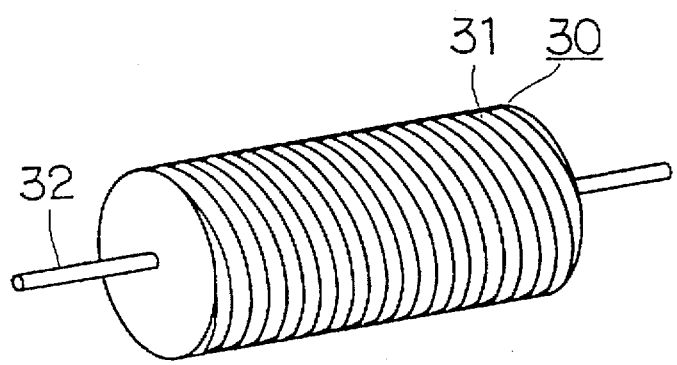
FIG. 6 is a perspective view showing a cylindrical electrode according to a further embodiment of the present invention.

FIG. 6 is a perspective view showing a cylindrical electrode 30 according to a further embodiment of the present invention. The cylindrical electrode 30 according to this embodiment is provided with a spiral groove 31 on its electrode surface 30. The cylindrical electrode 30 of this embodiment is also provided to rotate following rotation of a rotation axis 32. According to this embodiment, the spiral groove 31 is formed on the electrode surface. Thus, projections and depressions are spirally formed along the periphery of the electrode surface. When such an electrode 30 is rotated on a substrate, the projections most approaching the substrate surface continuously move in the direction of the rotation axis 32, due to rotation of the electrode 30. When the cylindrical electrode 30 according to this embodiment is employed, therefore, a thin film can be formed while moving a plasma generating region continuously along the direction of the rotation axis 32.

According to this embodiment, the projections serving as electrode parts for plasma generation are periodically present at regular intervals with respect to the rotary electrode 30. Thus, the plasma generating portion can be limited and periodically moved. Thus, a homogeneous thin film can be formed by limiting the plasma generating region.

According to this embodiment, further, the spiral groove 31 is formed on the electrode surface, whereby a reaction gas can be efficiently supplied to a plasma space due to rotation of this groove 31. Since the groove 31 is spiral, the reaction gas can be moved not only in the direction of rotation but in the direction of the rotation axis 32, whereby the reaction gas can be further efficiently supplied.

Figure 7:
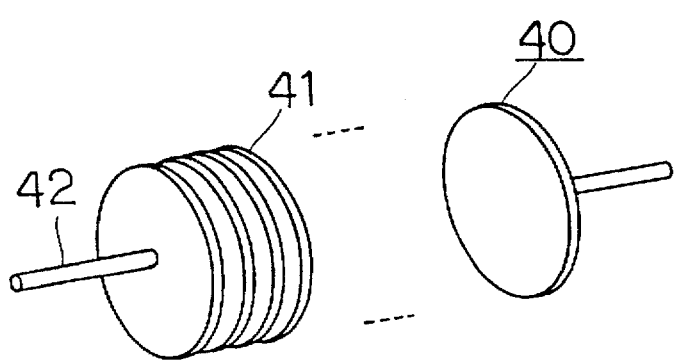
FIG. 7 is a perspective view showing a rotary electrode according to a further embodiment of the present invention.

FIG. 7 is a perspective view showing an electrode according to a further embodiment of the present invention. In the embodiment shown in FIG. 7, a plurality of disc electrodes 41 are arranged along a rotation axis 42 to be parallel to each other, thereby forming a rotary electrode 40. The plurality of disc electrodes 41 are mounted on the rotation axis 42. According to this embodiment, the disc electrodes 41 are arranged at regular intervals, so that a plasma space is defined between the disc electrodes 41 and a substrate. Thus, the plasma space is formed in correspondence to the distance between the disc electrodes 41, so that a thin film is formed only on a corresponding region of the substrate. Thus, the electrode 40 of this embodiment can be employed in case of forming a thin film only on a specific region of a substrate.

When the cylindrical electrode 40 according to this embodiment is moved with respect to the substrate, on the other hand, it is possible to form a thin film in stripe-shapes as if the regions corresponding to the respective disc electrodes 41 are scanned. When the overall electrode 40 is moved in a direction perpendicular to the disc surfaces of the disc electrodes 41, further, it is possible to form a planar thin film.

According to this embodiment, spaces are defined between the disc electrodes 41. Therefore, a reaction gas can be supplied through such spaces. When the reaction gas is supplied to such spaces between the disc electrodes 41, for example, it is possible to further efficiently supply the reaction gas to the plasma generating region through such spaces. According to the present invention, further, it is also possible to employ an electrode prepared by embedding insulators in such spaces.

When the disc electrodes 41 are slightly inclined from the direction perpendicular to the rotation axis 42, further, the plasma generating region can be moved in a direction along the rotation axis 42, similarly to the case of the spiral groove 31 shown in FIG. 6. When the disc electrodes 41 are thus inclined, therefore, a continuous thin film can be formed on the overall surface of the substrate.

Figure 8:
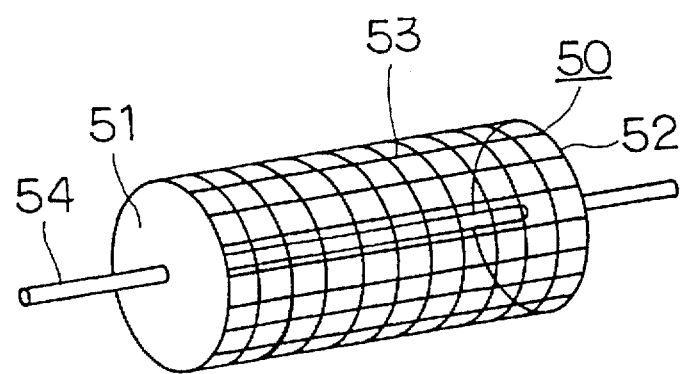
FIG. 8 is a perspective view showing a rotary electrode according to a further embodiment of the present invention.

FIG. 8 is a perspective view showing a rotary electrode 50 according to a further embodiment of the present invention. In the embodiment shown in FIG. 8, discoidal side plates 51 and 52 are mounted on a rotation axis 54, and wires 53 are spread across the discoidal side plates 51 and 52 in the form of a network. When such a rotary electrode 50 is employed, a plasma space is defined between the wires 53 and a substrate. Due to the wires 53 provided on the peripheral surface of the rotary electrode 50 in the form of a network, plasma can be intermittently generated. Due to the network form, further, it is also possible to supply a reaction gas to the plasma generating region through spaces defined in the rotary electrode 50.

Figure 9:
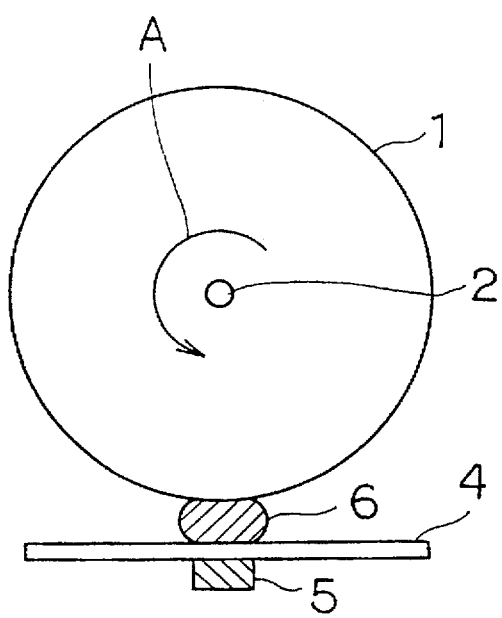
FIG. 9 is a model diagram showing a state of forming a thin film with the cylindrical electrode according to the embodiment shown in FIGS. 1 and 2.

FIG. 9 is a model diagram showing a state of forming a thin film with the cylindrical electrode 1 shown in FIGS. 1 and 2. In this embodiment, a linear electrode 5 consisting of a metal or the like is provided under the substrate 4 as a grounding electrode. When high-frequency power or dc power is applied to the cylindrical electrode 1, plasma is generated in a region 6 between an electrode surface part which is closest to the grounding electrode 5 and the grounding electrode 5, as shown in FIG. 9. While the cylindrical electrode 1 rotates along arrow A, its surface approaches closest to the grounding electrode 5 regularly at the same position, whereby the plasma is regularly generated in the same position. On the other hand, reaction gas molecules which are present around the electrode surface move with the rotation of the electrode surface along arrow A, to be supplied to the plasma generating region 6. Thus, it is achieved that the reaction gas molecules are regularly constantly supplied to the plasma generating region 6, whereby a homogeneous thin film can be formed at a higher speed.

Figure 10:
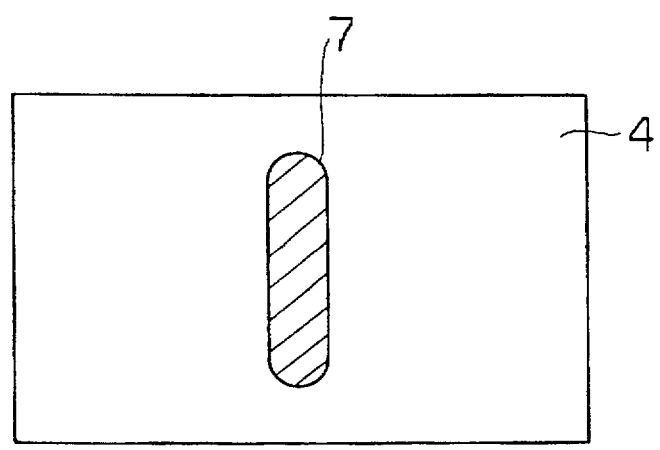
FIG. 10 is a plan view showing a linear thin film formed by the thin film formation shown in FIG. 9.

FIG. 10 is a plan view showing a thin film which is formed without moving the position of the cylindrical electrode 10 with respect to the substrate 4. As shown in FIG. 10, a linear thin film 7 is formed.

According to this embodiment, the grounding electrode 5 is formed by a linear electrode, whereby the generated plasma can be concentrated. Thus, the plasma can be generated with lower power.

EXAMPLE 1

Figure 11:
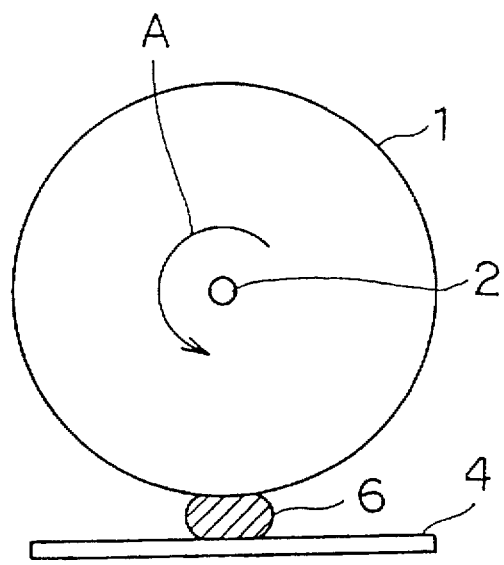
FIG. 11 is a model diagram showing a state of forming a thin film with a cylindrical electrode without provision of a linear grounding electrode.

A cylindrical electrode shown in FIG. 11 was employed for forming an amorphous silicon thin film. Namely, no linear grounding electrode was provided in this Example in a structure similar to that in FIG. 9. A reaction gas was prepared by $SiH_4$ gas of 0.1% employing He gas as dilution gas. The atmosphere pressure was set at 1 atm. The substrate was a glass substrate.

The cylindrical electrode had a diameter of 100 mm and a length of 100 mm along its rotation axis.

The distance between the cylindrical electrode and the substrate was set to be 0.1 mm. The mean free path of $SiH_4$ molecules is about 100 μm.

The rotational frequency of the cylindrical electrode was set at 18,000 rpm, so that its peripheral velocity was 94 m/sec.

High-frequency power of 300 W was applied at 150 MHz. The film was formed for 3 minutes.

Consequently, an amorphous silicon thin film of 1.5 μm in thickness was formed as a linear thin film such as that shown in FIG. 10.

Comparative Example

As a comparative example, a thin film was formed under conditions similar to those in Example 1, except that the cylindrical electrode 1 was not rotated. Consequently, the thickness of an amorphous thin film formed in this example was 0.2 μm, while this film was heterogeneous with an irregular surface.

EXAMPLE 2

An apparatus having a cylindrical electrode and a linear grounding electrode such as that shown in FIG. 9 was employed to form an amorphous silicon thin film. The linear grounding electrode was formed by an electrode, consisting of aluminum, having a width of 1 mm and a length of 100 mm. High-frequency power of 200 W was applied to the cylindrical electrode at 150 MHz. The remaining conditions were absolutely similar to those in Example 1.

An amorphous silicon thin film of 1.5 μm in thickness was formed as a linear thin film such as that shown in FIG. 10 in a film forming time of 3 minutes. As clearly understood from this, it was possible to concentrate the electric field by providing the linear grounding electrode, for forming an amorphous silicon thin film equivalent to that in Example 1 at the power of 200 W which was lower than that of 300 W employed in Example 1.

EXAMPLE 3

A cylindrical electrode and a linear grounding electrode similar to those shown in FIG. 9 were employed for forming an amorphous silicon thin film while moving a substrate. The substrate was moved by 10 cm perpendicularly to the direction of the rotation axis of the cylindrical electrode at a speed of 1 mm/min. The film forming conditions were similar to those in Example 2. Consequently, an amorphous silicon thin film of 5000 Å in thickness was formed in a region of 10 cm square. The surface of the thin film was flat with no fine grains. The film quality was homogeneous and excellent.

EXAMPLE 4

Figure 12:
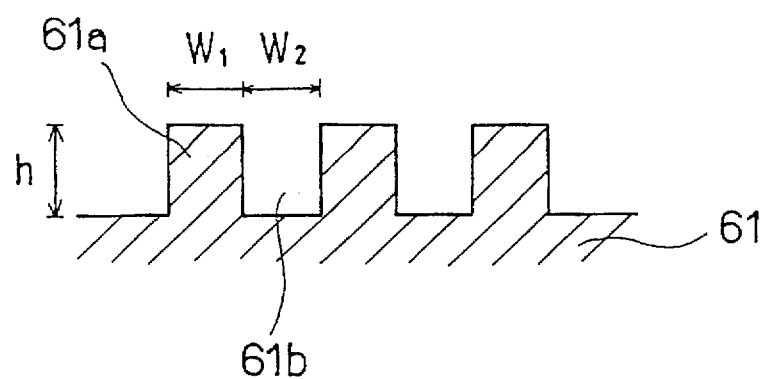
FIG. 12 is a sectional view showing a surface of a cylindrical electrode provided on its surface with spiral projections and grooves along the direction of its rotation axis employed in an Example of the present invention.

A rotary electrode was prepared by forming a spiral groove on the surface of a cylindrical electrode 61. FIG. 12 is a sectional view showing the surface of such a cylindrical electrode 61 taken along its rotation axis. As shown in FIG. 12, spiral projections 61a and spiral grooves 61b were formed on the surface of the cylindrical electrode 61. The height h of each projection 61a was 1 mm, and widths $W_1$ and $W_2$ of each spiral projection 61a and each spiral groove 61b were 0.5 mm. The diameter of the cylindrical electrode 61 was 100 mm, and the length along a rotation axis was 100 mm.

The cylindrical electrode 61 was rotated to form a silicon thin film, under remaining conditions similar to those in Example 2. An amorphous silicon thin film of 1.8 μm in thickness was formed in a film forming time of 3 minutes. An excellent thin film having a flat surface with no fine grains was homogeneously formed.

As compared with Example 2, it is clearly understood that film formation can be made at a higher speed by making the surface of the cylindrical electrode irregular.

Figure 13:
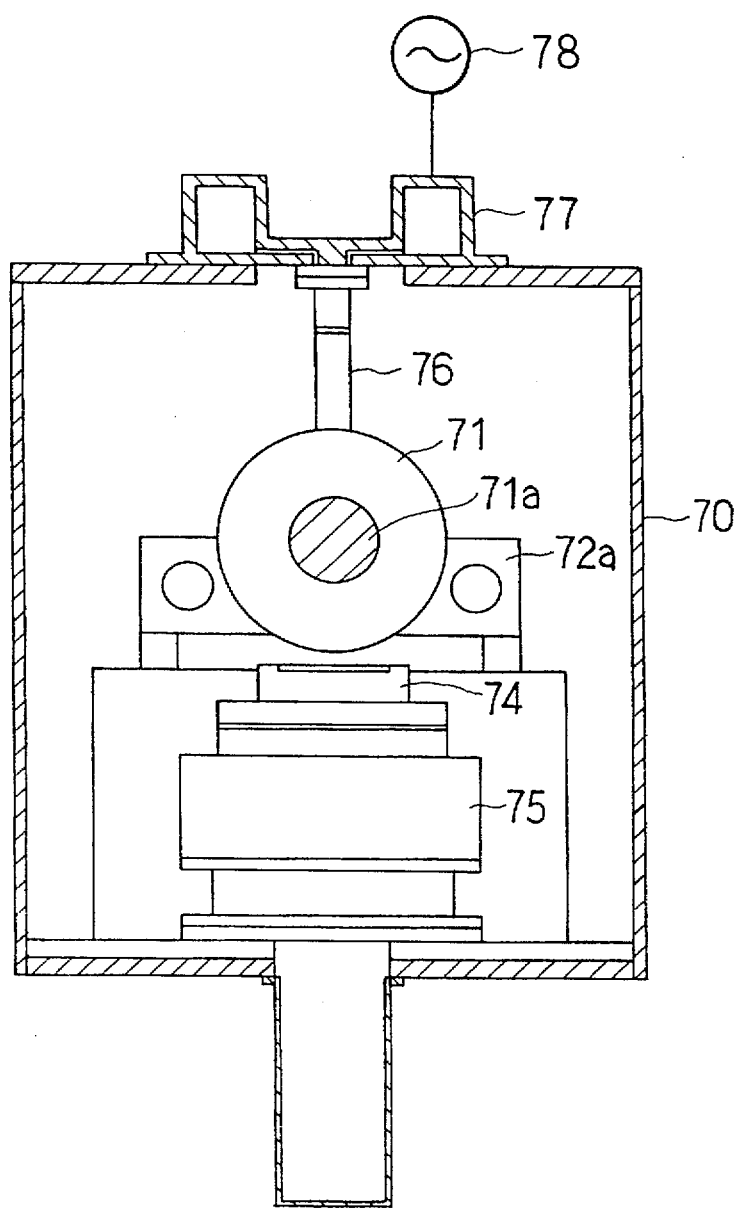
FIG. 13 is a side sectional view showing a film forming apparatus according to a further embodiment of the present invention.
Figure 14:
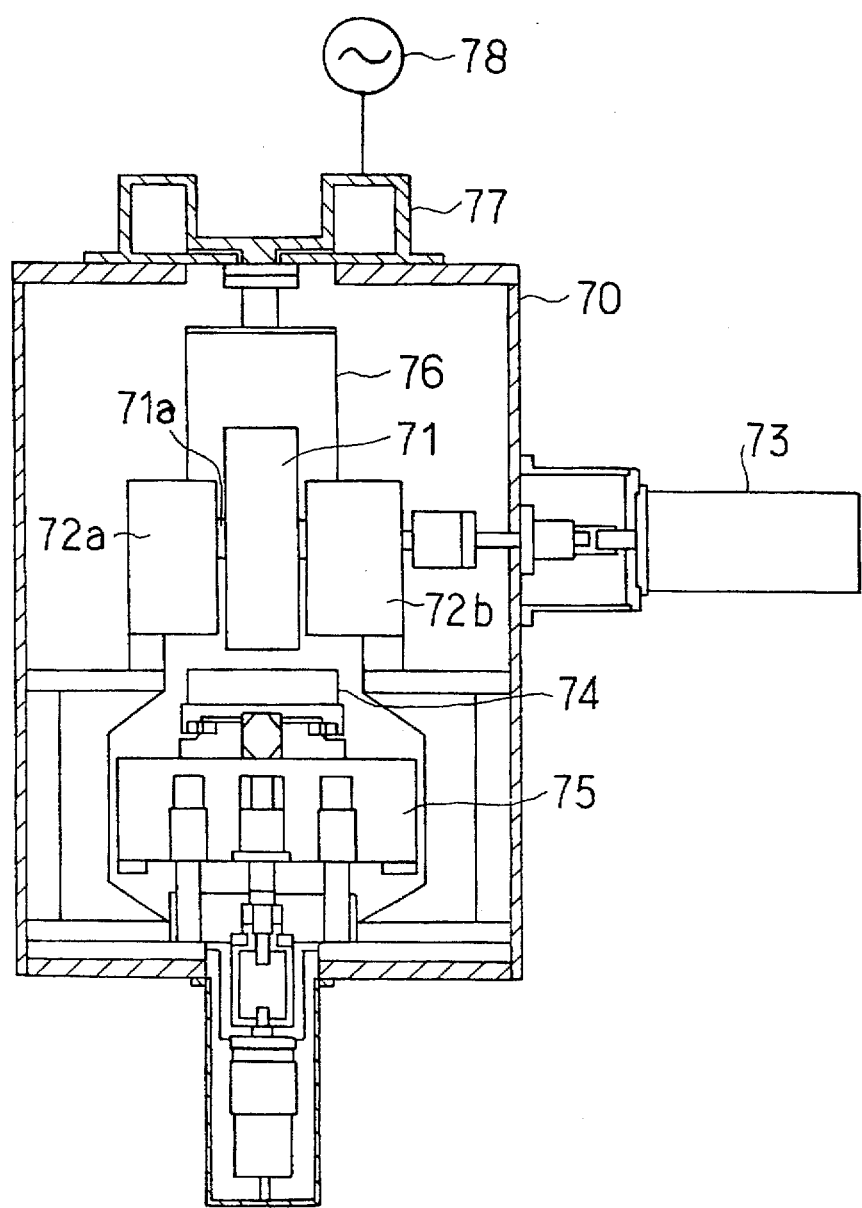
FIG. 14 is a front sectional view showing the film forming apparatus according to the embodiment of the present invention.

FIGS. 13 and 14 are side and front sectional views showing a film forming apparatus according to a further embodiment of the present invention respectively. Referring to FIGS. 13 and 14, a rotary electrode 71 which is a cylindrical electrode is provided in a reaction vessel 70. A rotation axis 71a at the center of the rotary electrode 71 is supported by bearings 72a and 72b which are provided on both sides thereof. As shown in FIG. 14, the bearing 71a is rotated by a motor 73 serving as driving means.

A substrate holder 74 for receiving a substrate is provided under the rotary electrode 71. This substrate holder 74 is placed on a table 75, which is movable in the horizontal direction (X-axis direction) and the vertical direction (Z-axis direction) in FIG. 13 respectively.

The rotary electrode 71 is 300 mm in diameter and 100 mm in width, and has the maximum rotational speed of 5000 rpm with a peripheral velocity of 79 m/sec.

Figure 19:
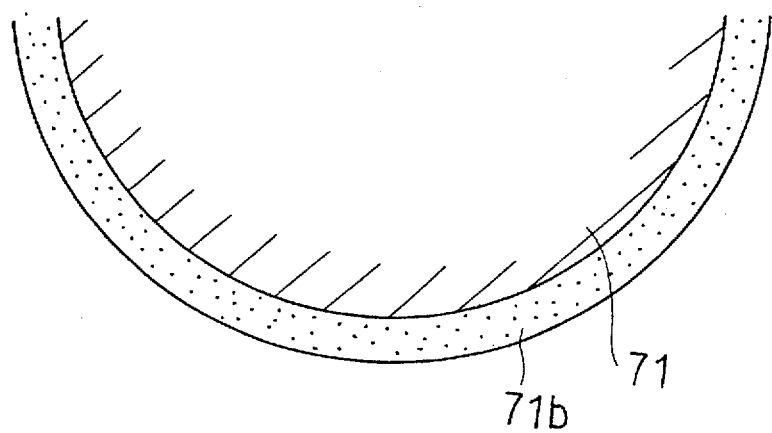
FIG. 19 is a sectional view showing an insulating film on a rotary electrode surface in the embodiment of the present invention.

FIG. 19 is a sectional view showing an insulating film 71b which is formed on the surface of the rotary electrode 71. As shown in FIG. 19, the insulating film 71b is formed on the overall surface of the rotary electrode 71 employed in this embodiment. According to this embodiment, the insulating film 71b is prepared from alumina, and its thickness is set at 100 μm.

A high-frequency power source 78 for applying high-frequency power to the rotary electrode 71 is connected to a resonator 77 which is provided on an upper portion of the reaction vessel 70. The power from the high-frequency power source 78 passes through the resonator 77 and a plate type power transmission member 76, to be supplied to the rotation axis 71a through the bearings 72a and 72b. Plasma is generated between the rotary electrode 71 which is supplied with the high-frequency power in this manner and the substrate holder 74.

A reaction gas is introduced to the gap between the rotary electrode 71 and the substrate due to rotation of the rotary electrode 71, and decomposed by the plasma generated between the rotary electrode 71 and the substrate, so that a thin film is formed on the substrate. When the table 75 is moved along the X-axis, such a thin film can be continuously formed on the substrate.

Figure 15:
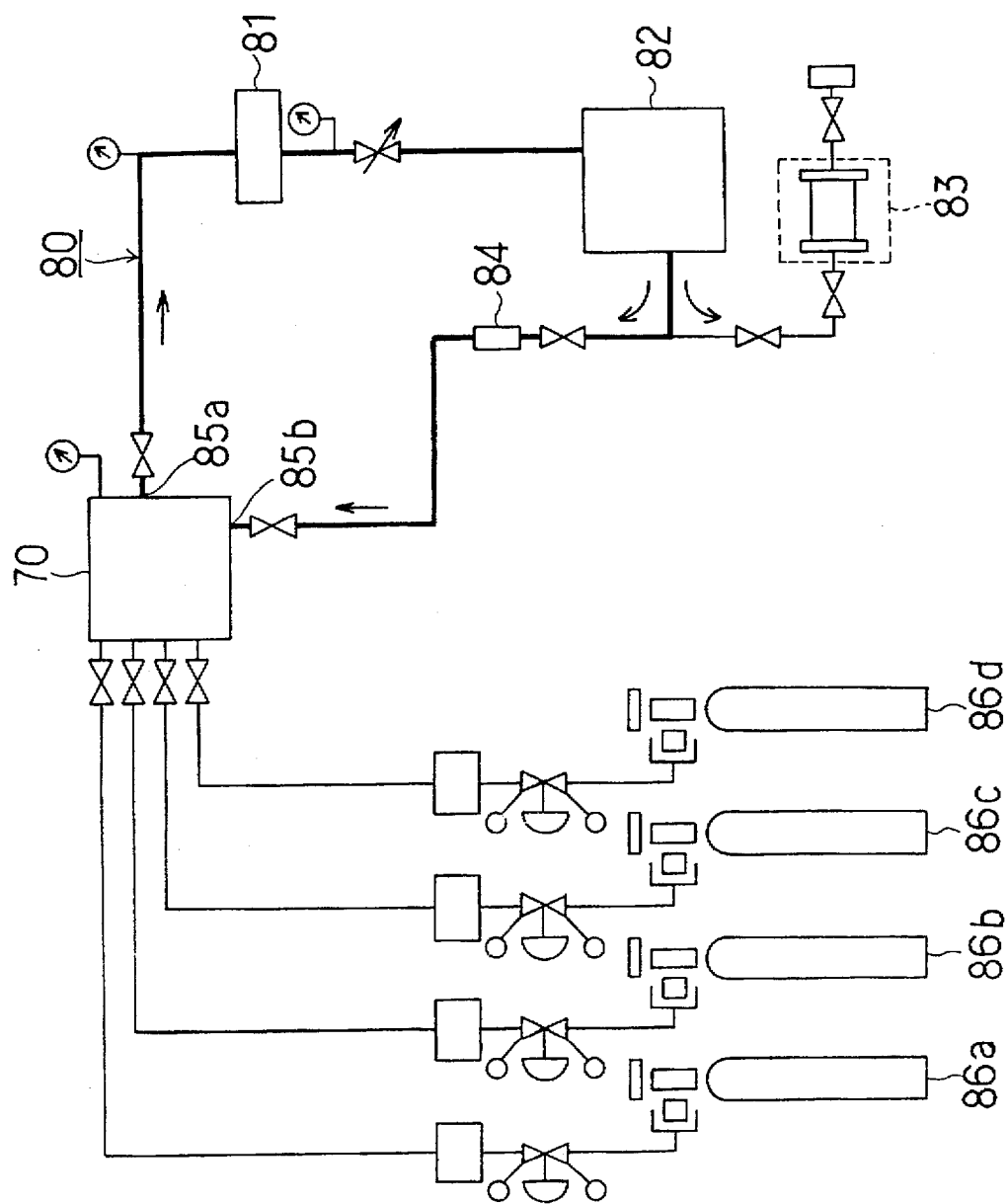
FIG. 15 is a block diagram for illustrating a gas circulatory system in the embodiment of the present invention.

FIG. 15 is a schematic diagram for illustrating a gas circulatory system 80 which is connected to the reaction vessel 70. The gas stored in the reaction vessel 70 is delivered from an exhaust port 85a to the gas circulatory system 80 by a dry pump 82, and returned into the reaction vessel 70 again from a supply port 85b. Fine powder which is contained in the gas delivered to the gas circulatory system 80 is removed by a powder removing filter 81. This fine powder has been generated due to the decomposition of the reaction gas in the reaction vessel 70. Such fine powder contained in the reaction vessel 70 is incorporated into the thin film which is formed on the substrate to disadvantageously make the film irregular and deteriorate the film quality. The powder removing filter 81 is adapted to remove such fine powder.

Then, the gas passes through the dry pump 82 and a water adsorption tube 84, to be returned into the reaction vessel 70 from the supply port 85b. Exhaust gas discharged from the dry pump 82 passes through an $SiH_4$ excluder 83 to be discharged to the exterior.

The reaction vessel 70 is supplied with gases from an He vessel 86a, an $H_2$ vessel 86b, a $CH_4$ vessel 86c, and an $SiH_4$ vessel 86d. These gases are an exemplary combination for a raw material gas for forming an SiC thin film.

Figure 16:
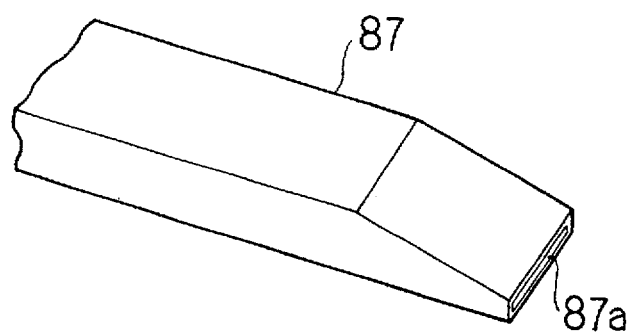
FIG. 16 is a perspective view showing a duct in the embodiment of the present invention.

FIG. 16 is a perspective view showing a duct 87 which is provided in the reaction vessel 70 for serving as a gas exhaust port for the aforementioned gas circulatory system 80. As shown in FIG. 16, the forward end of the duct 87 is so tapered that the same can be arranged in a narrow region, and a suction port 87a is formed on the forward end.

Figure 17:
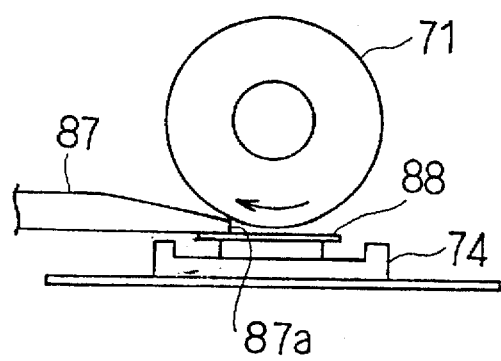
FIG. 17 is a front elevational view showing a state of arrangement of the duct shown in FIG. 16.

FIG. 17 is a front elevational view for illustrating the state of arrangement of the duct 87 in the reaction vessel 70. As shown in FIG. 17, the duct 87 is so arranged that the suction port 87a provided on its forward end approaches the gap between the rotary electrode 71 and a substrate 88. When the suction port 87a thus approaches the plasma generating region, fine grains can be further efficiently removed from the thin film forming region.

The flow rate of suction in the duct 87 is preferably higher than the peripheral velocity of the rotary electrode 71, as described above. According to this embodiment, the former is set at 2 times the latter.

Figure 18:
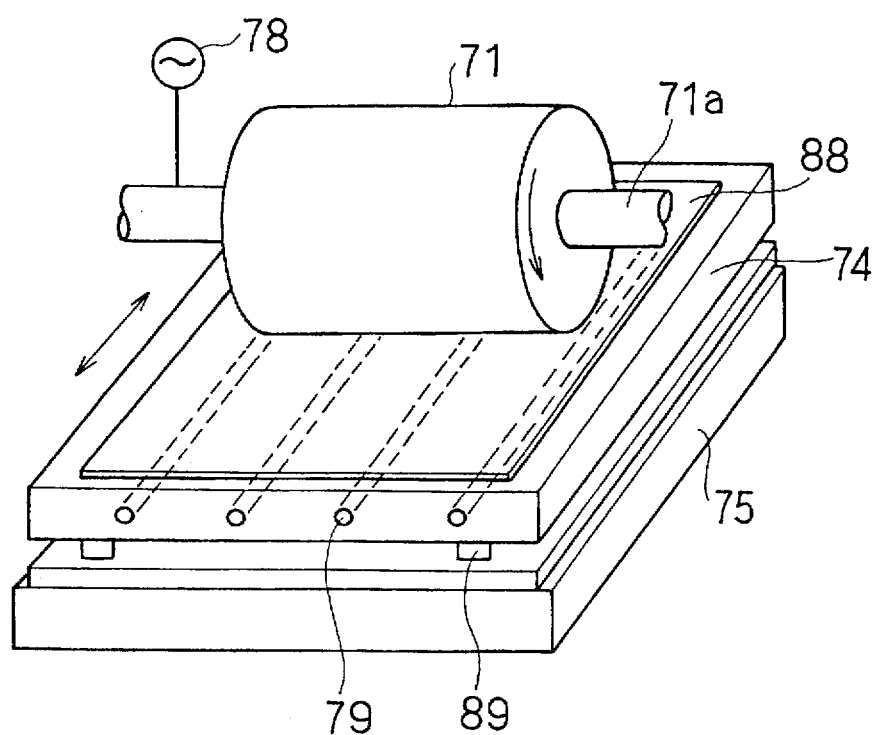
FIG. 18 is a perspective view showing a heater for a substrate holder in the embodiment of the present invention.

FIG. 18 is a perspective view for illustrating a heater 79 provided in the substrate holder 74. As shown in FIG. 18, the heater 79 is provided in the substrate holder 74. This heater 79, which is a cylindrical cartridge heater, can heat the substrate 88.

Figure 20:
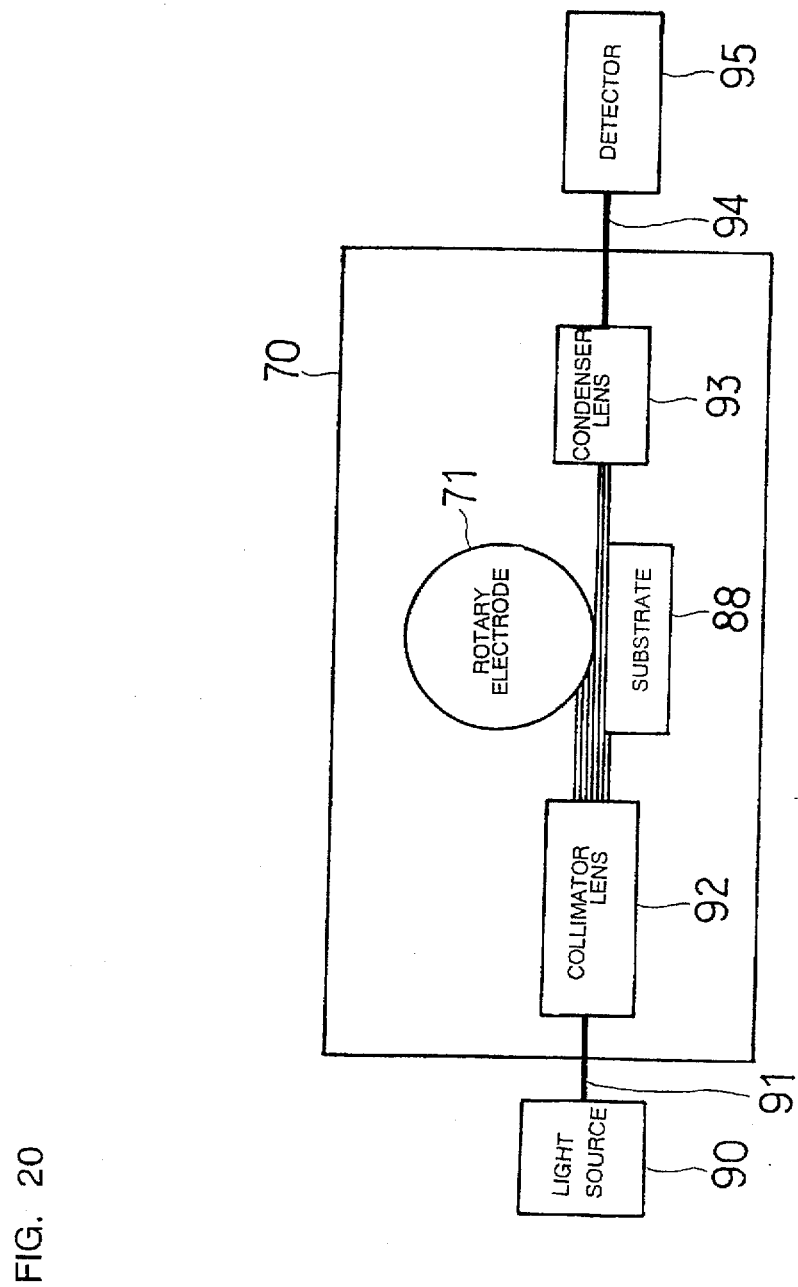
FIG. 20 is a schematic block diagram for illustrating a system for measuring the gap between a rotary electrode and a substrate in the embodiment of the present invention.

FIG. 20 is a schematic block diagram showing an exemplary apparatus for measuring the gap between the rotary electrode 71 and the substrate 88 provided in the reaction vessel 70. Referring to FIG. 20, a collimator lens 92 and a condenser lens 93 are arranged in the reaction vessel 70 to be opposed to each other on opposite sides of the gap between the rotary electrode 71 and the substrate 88. A light source 90 is connected to the collimator lens 92 through an optical fiber member 91. The light source 90 can be a laser beam source, for example. In more concrete terms, a laser beam source having a wavelength of 935 nm and emission power of 5 mW can be employed, for example. On the other hand, a detector 95 is connected to the condenser lens 93 through another optical fiber member 94. The detector 95 can be a photodiode, for example.

Light outgoing from the light source 90 passes through the optical fiber member 91 and is shaped by the collimator lens 92, to be applied to the gap between the rotary electrode 71 and the substrate 88. The light is applied from the collimator lens 92 as a beam wider than the gap between the rotary electrode 71 and the substrate 8. Thus, the beam is obstructed by the rotary electrode 71 and the substrate 88 so that a narrower laser beam passing through the gap is received and condensed by the condenser lens 93 and detected by the detector 95 through the optical fiber member 94. The light quantity detected by the detector 95 varies with the distance between the rotary electrode 71 and the substrate 88. Thus, the gap between the rotary electrode 71 and the substrate 88 can be measured by measuring this light quantity.

According to this embodiment, the gap between the rotary electrode 71 and the substrate 88 can be adjusted by vertically moving the table 75 shown in FIGS. 13 and 14 in response to the information of the distance between the rotary electrode 71 and the substrate 88 measured in the aforementioned manner.

EXAMPLE 5

A gas circulatory system such as that shown in FIG. 15 was connected to a reaction vessel by employing a duct of Teflon, a dry circulating pump having a pumping speed of 1 m$^3$/min. and a powder removing filter having meshes of 0.1 μm, for forming an Si film. Consequently, a homogeneous Si film was formed while contamination of the film with fine grains was extremely reduced as compared with a case in which the gas circulatory system to the reaction vessel.

EXAMPLE 6

A high frequency of 150 MHz was applied in pulses with a cycle of 10 kHz (100 μsec) and in a duty ratio of 1/50 with power of 500 W, for forming an Si film. As compared with a case of continuously applying a high frequency not in the form of pulses, it was possible to form a more homogeneous Si film with small contamination with fine grains.

EXAMPLE 7

1% of hydrogen gas was added into a reaction vessel, for studying the effect of such addition of hydrogen gas. Consequently, it was possible to form a homogeneous Si film with extremely small generation of fine grains and small contamination of the film with the fine grains as compared with a case in which hydrogen gas was not added.

EXAMPLE 8

A substrate was heated to 300° C. for forming an Si film. The remaining film forming conditions were similar to those in Example 1. It was possible to obtain an Si film having excellent quality with photoconductivity of $10^{-5}$ $(\Omega cm)^{-1}$, which was extremely improved as compared with that of $10^{-9}$ $(\Omega cm)^{-1}$ in a case in which the substrate was not heated.

EXAMPLE 9

A reaction gas was prepared by adding He to 0.1% of SiH$_4$ and 0.5% of CH$_4$ so that the mixed gas had a pressure of 1 atm., and power of 1000 W was applied to a rotary electrode, for forming an SiC thin film on a glass substrate for 10 seconds. It was possible to form an SiC thin film of good quality having a thickness of 2.4 μm in a ratio of C/Si of at least 98%.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film forming method for forming a thin film on a substrate by chemical reaction, said method comprising the steps of:
    arranging said substrate in a reaction vessel;
    arranging a cylindrical rotary electrode having a continuous electrode surface adjacent a surface of said substrate;
    supplying a reaction gas between said substrate surface and said rotary electrode by rotating said rotary electrode to make said electrode surface move and pass by said substrate surface; and
    applying high-frequency power or dc power to said rotary electrode thereby generating a plasma between said substrate surface and said rotary electrode to form said thin film on said substrate by chemical reaction of said reaction gas being supplied into said plasma.

2. The film forming method in accordance with claim 1, further comprising relatively moving a plasma generating region with respect to said substrate upon forming said thin film.

3. The film forming method in accordance with claim 2, wherein said step of relatively moving said plasma generating region comprises moving said rotary electrode overall, moving said substrate, or moving both said rotary electrode overall and said substrate.

4. The film forming method in accordance with claim 2, wherein said surface of said rotary electrode includes a spiral projection thereon, and said step of relatively moving said plasma generating region comprises moving a part of said projection adjacent and facing said substrate surface due to said rotating of said rotary electrode.

5. The film forming method in accordance with claim 4, wherein said step of relatively moving said plasma generating region is carried out by said rotating of said rotary electrode and by further comprising moving said rotary electrode overall, moving said substrate or moving both said rotary electrode overall and said substrate.

6. The film forming method in accordance with claim 1, wherein said rotating of said rotary electrode is carried out so that said electrode surface of said rotary electrode has a peripheral velocity from 10 m/sec to a velocity of sound.

7. The film forming method in accordance with claim 1, wherein a total gas pressure in said reaction vessel is at least 1 Torr.

8. The film forming method in accordance with claim 1, further comprising supplying an inert gas into said reaction vessel.

9. The film forming method in accordance with claim 8, wherein said inert gas comprises at least one gas selected from a group consisting of He, Ne, Ar, Kr and Xe.

10. The film forming method in accordance with claim 8, wherein said reaction gas has a partial pressure of at least 0.01 Torr.

11. The film forming method in accordance with claim 1, further comprising supplying hydrogen gas into said reaction vessel.

12. The film forming method in accordance with claim 11, wherein said hydrogen gas has a partial pressure of at least 1 Torr.

13. The film forming method in accordance with claim 1, wherein said step of applying high frequency power or dc power comprises applying said high-frequency power in a pulse form.

14. The film forming method in accordance with claim 13, wherein said high-frequency power applied in said pulse form has a duty ratio of at least 1/100.

15. The film forming method in accordance with claim 13, wherein high-frequency power applied in said pulse form has a modulation frequency of at least 100 kHz.

16. The film forming method in accordance with claim 1, wherein said step of arranging said rotary electrode is carried out to form a gap between said electrode surface and said substrate surface, wherein said gap measures 0.01 mm to 1 mm.

17. The film forming method in accordance with claim 1, further comprising maintaining temperature of said substrate at not more than 500° C.

18. A film forming method comprising the steps of:
applying high-frequency power or dc power to a cylindrical rotary electrode having a continuous electrode surface, thereby generating a plasma;
supplying a reaction gas into said plasma to form a thin film on a substrate by chemical reaction; and
rotating said electrode.

19. A film forming apparatus for forming a thin film on a substrate by chemical reaction, said apparatus comprising:
a substrate holder arranged in a reaction vessel and adapted to receive said substrate thereon;
a rotatable cylindrical rotary electrode having a continuous electrode surface arranged adjacent a surface of said substrate;
driving means for rotating said rotary electrode;
reaction gas supply means for supplying a reaction gas into said reaction vessel; and
a power source for applying high-frequency power or dc power to said rotary electrode for generating a plasma between said substrate surface and said rotary electrode;
wherein said rotary electrode is adapted to rotate so that said electrode surface moves and passes by said substrate surface, thereby supplying said reaction gas between said substrate surface and said rotary electrode.

20. The film forming apparatus in accordance with claim 19, wherein said continuous electrode surface is a regular smooth cylindrical surface.

21. The film forming apparatus in accordance with claim 19, wherein said continuous electrode surface of said rotary electrode is an irregular surface.

22. The film forming apparatus in accordance with claim 21, wherein said irregular surface comprises a stripe-shaped projection or depression extending along a direction of a rotation axis of said rotary electrode.

23. The film forming apparatus in accordance with claim 21, wherein said irregular surface comprises a projection or depression extending continuously along a circumferential direction of rotation.

24. The film forming apparatus in accordance with claim 19, further comprising an insulating region and a conductive region in said rotary electrode surface such that said conductive region restrictively provides an electrode region for generating said plasma in said electrode surface.

25. The film forming apparatus in accordance with claim 24, wherein said conductive region has a stripe shape extending along a direction of a rotation axis of said rotary electrode.

26. The film forming apparatus in accordance with claim 24, wherein said conductive region extends continuously along a circumferential direction of rotation of said rotary electrode.

27. The film forming apparatus in accordance with claim 19, wherein said rotary electrode comprises a plurality of discs arranged along a direction of a rotation axis of said electrode so as to be parallel to each other.

28. The film forming apparatus in accordance with claim 19, wherein said rotary electrode is arranged in such a manner so as to be movable relative to said substrate upon forming said thin film on said substrate.

29. The film forming apparatus in accordance with claim 19, further comprising a linear grounding electrode or a linear magnet provided on a side of said substrate opposite to said rotary electrode, for controlling said plasma generated between said substrate and said rotary electrode.

30. The film forming apparatus in accordance with claim 19, further comprising substrate holder moving means for moving said substrate holder relative to said rotary electrode.

31. The film forming apparatus in accordance with claim 19, wherein said substrate holder comprises a heater for heating said substrate.

32. The film forming apparatus in accordance with claim 19, further comprising an insulating film covering said electrode surface overall.

33. The film forming apparatus in accordance with claim 32, wherein said insulating film comprises ceramics or hard carbon.

34. The film forming apparatus in accordance with claim 32, wherein said insulating film has a thickness of 1 μm to 1 mm.

35. The film forming apparatus in accordance with claim 19, further comprising a gas circulatory system connected to said reaction vessel for circulating said gas in said reaction vessel and collecting and removing fine grains from said gas.

36. The film forming apparatus in accordance with claim 35, further comprising a duct provided in said reaction vessel for introducing said gas into said gas circulatory system.

37. The film forming apparatus in accordance with claim 35, further comprising a powder removing filter arranged in said gas circulatory system for removing said fine grains from said gas.

38. The film forming apparatus in accordance with claim 35, wherein said gas circulatory system has a gas circulation flow rate of 1 to 100 $m^3$/min.

39. The film forming apparatus in accordance with claim 19, further comprising means for measuring a concentration of said reaction gas.

40. The film forming apparatus in accordance with claim 19, further comprising means for measuring a temperature of said surface of said rotary electrode.

41. The film forming apparatus in accordance with claim 19, further comprising means for measuring a gap between said electrode surface and said substrate surface.

42. A film forming apparatus comprising a rotatably arranged cylindrical rotary electrode having a continuous electrode surface, means for applying high-frequency power or dc power to said electrode thereby generating a plasma, and means for supplying a reaction gas into said plasma for forming a thin film on a substrate by chemical reaction.

43. The film forming method in accordance with claim 17, further comprising maintaining said temperature of said substrate at at least about 30° C.

44. The film forming method in accordance with claim 1, wherein said cylindrical rotary electrode is formed by arranging a plurality of discs in parallel with one another along a rotation axis of said rotary electrode.

45. A film forming apparatus for forming a thin film on a substrate by chemical reaction, said apparatus comprising:

a substrate holder arranged in a reaction vessel and adapted to receive said substrate thereon;

a rotatable rotary electrode having an electrode surface arranged adjacent a surface of said substrate;

driving means for rotating said rotary electrode;

reaction gas supply means for supplying a reaction gas into said reaction vessel; and a power source for applying high-frequency power or dc power to said rotary electrode for generating a plasma between said substrate surface and said rotary electrode;

wherein said rotary electrode is adapted to rotate so that said electrode surface moves and passes by said substrate surface, thereby supplying said reaction gas between said substrate surface and said rotary electrode;

and further comprising an insulating region and a conductive region in said rotary electrode surface such that said conductive region restrictively provides an electrode region for generating said plasma in said electrode surface.

46. The film forming apparatus in accordance with claim 45, wherein said conductive region has a stripe shape extending along a direction of a rotation axis of said rotary electrode.

47. The film forming apparatus in accordance with claim 45, wherein said conductive region extends continuously along a circumferential direction of rotation of said rotary electrode.

48. A film forming apparatus for forming a thin film on a substrate by chemical reaction, said apparatus comprising:

a substrate holder arranged in a reaction vessel and adapted to receive said substrate thereon;

a rotatable rotary electrode having an electrode surface arranged adjacent a surface of said substrate;

driving means for rotating said rotary electrode;

reaction gas supply means for supplying a reaction gas into said reaction vessel; and a power source for applying high-frequency power or dc power to said rotary electrode for generating a plasma between said substrate surface and said rotary electrode;

wherein said rotary electrode is adapted to rotate so that said electrode surface moves and passes by said substrate surface, thereby supplying said reaction gas between said substrate surface and said rotary electrode; and wherein said rotary electrode comprises a plurality of discs arranged along a direction of a rotation axis of said electrode so as to be parallel to each other.

49. A film forming apparatus for forming a thin film on a substrate by chemical reaction, said apparatus comprising:

a substrate holder arranged in a reaction vessel and adapted to receive said substrate thereon;

a rotatable rotary electrode having an electrode surface arranged adjacent a surface of said substrate;

driving means for rotating said rotary electrode;

reaction gas supply means for supplying a reaction gas into said reaction vessel; and a power source for applying high-frequency power or dc power to said rotary electrode for generating a plasma between said substrate surface and said rotary electrode;

wherein said rotary electrode is adapted to rotate so that said electrode surface moves and passes by said substrate surface, thereby supplying said reaction gas between said substrate surface and said rotary electrode; and wherein said rotary electrode comprises a rotator and a conductive wire serving as an electrode part for plasma generation arranged on a peripheral surface of said rotator.

* * * * *

UNITED STATES PATENT AND TRADEMARK OFFICE
CERTIFICATE OF CORRECTION

PATENT NO. : 5,711,814

DATED : Jan. 27, 1998

INVENTOR(S) : Mori

It is certified that error appears in the above-identified patent and that said Letters Patent is hereby corrected as shown below:

Col. 15, line 37, after "system" insert --was not connected--.

Col. 17, line 20, after "maintaining" insert --a--.

Signed and Sealed this

Twenty-first Day of April, 1998

Attest:

BRUCE LEHMAN

Attesting Officer

Commissioner of Patents and Trademarks